United States Patent
Kitamura et al.

(10) Patent No.: US 7,191,415 B2
(45) Date of Patent: Mar. 13, 2007

(54) CLEARANCE INSPECTION APPARATUS AND CLEARANCE INSPECTION METHOD

(75) Inventors: Tamotsu Kitamura, Nagano (JP); Norihide Hanami, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 91 days.

(21) Appl. No.: 11/104,615

(22) Filed: Apr. 13, 2005

(65) Prior Publication Data

US 2005/0233480 A1 Oct. 20, 2005

(30) Foreign Application Priority Data

Apr. 16, 2004 (JP) .............................. 2004-121842

(51) Int. Cl.
G06F 9/45 (2006.01)
G06F 17/50 (2006.01)

(52) U.S. Cl. ................... 716/5; 716/4; 716/12

(58) Field of Classification Search ................ 716/4–5, 716/12
See application file for complete search history.

(56) References Cited

U.S. PATENT DOCUMENTS

| | | | |
|---|---|---|---|
| 5,880,969 A | 3/1999 | Hama et al. | |
| 6,219,823 B1 | 4/2001 | Hama et al. | |
| 6,226,560 B1 | 5/2001 | Hama et al. | |
| 6,596,549 B2 | 7/2003 | Kitamura et al. | |
| 6,662,351 B2* | 12/2003 | Kitamura et al. | ............. 716/11 |
| 2002/0035720 A1* | 3/2002 | Kitamura et al. | ............. 716/11 |

FOREIGN PATENT DOCUMENTS

| | | |
|---|---|---|
| JP | 10-214898 | 8/1998 |
| JP | 2002-83006 | 3/2002 |

* cited by examiner

Primary Examiner—Paul Dinh
Assistant Examiner—Suresh Memula
(74) Attorney, Agent, or Firm—Staas & Halsey LLP

(57) ABSTRACT

A clearance inspection apparatus for inspecting clearance of a wiring line passing between vias on a substrate comprises: first determining means for determining vias adjacent on both sides of a reference via as first adjacent vias, the reference via and the first adjacent vias belonging to a first via row, wherein the reference via serves as a reference in clearance inspection; second determining means for determining vias adjacent to the first adjacent vias as second adjacent vias, the second adjacent vias belonging to a second via row which is adjacent to the first via row; and third determining means for determining a via located between the second adjacent vias as an inspection target via, wherein the clearance inspection apparatus inspects the clearance of the wiring line passing between the reference via and the inspection target via.

10 Claims, 13 Drawing Sheets

| VIA ROW | REFERENCE VIA | INSPECTION TARGET VIA |
|---|---|---|
| A1 | V9 | V10, V6 |
|  | V10 | V11, V7 |
|  | V11 |  |
| A2 | V4 | V1 |
|  | V5 | V6, V1 |
|  | V6 | V7, V1 |
|  | V7 | V2, V3 |
|  | V8 | V3 |
| A3 |  |  |

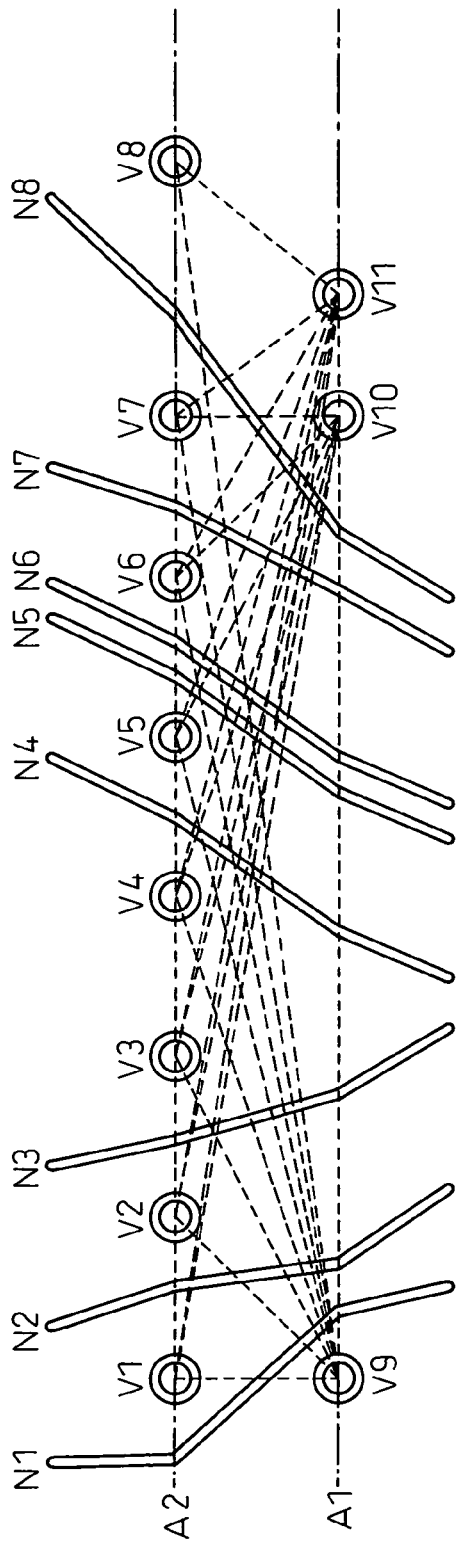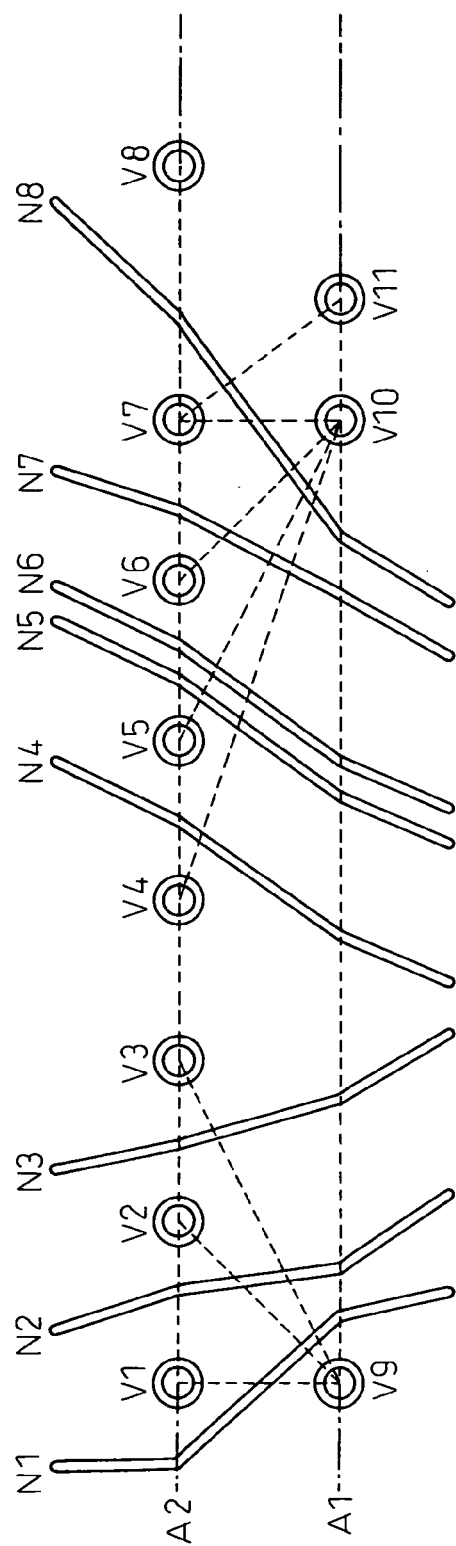

CLEARANCE INSPECTION APPARATUS AND CLEARANCE INSPECTION METHOD

BACKGROUND OF THE INVENTION

1. Field of the Invention

The present invention relates to a clearance inspection apparatus and method for inspecting the clearance of wiring lines passing between vias on a substrate.

2. Description of the Related Art

In a semiconductor package such as a PBGA or EBGA package, a wiring pattern is designed so as to connect the pads (for example, bonding pads or flip chip pads), to be electrically connected to electrode terminals on a semiconductor chip, to the vias (lands) provided along the periphery thereof, or to connect between the vias.

As one example of a wiring pattern design method, there is disclosed in Japanese Unexamined Patent Publication No. 2002-083006 a method in which only wiring routes are determined in advance in a rough wiring step, and then, in a wiring forming step, the wiring lines are laid automatically and uniformly by considering clearances (lines and spaces) while checking them against the actual design rules.

Further, in Japanese Unexamined Patent Publication No. 10-214898, there is disclosed an automatic wiring method that employs an any-angle wiring technique to make effective use of wiring areas, while allowing wiring line spacing and wiring line width to be increased where space permits.

The result of automatic wiring differs depending on setting conditions. To address this, one possible design method is to determine which condition yields what wiring result, by changing the setting conditions for the nets between pads and vias or between vias in various ways, and to select the optimum setting conditions. Another possible design method is to change the positions of vias based on the result of the automatic wiring. In either case, the wiring lines passing between various kinds of obstacles, in particular, vias, must be inspected for wiring line spacing, i.e., the clearance (line and space). Usually, in a wiring line clearance inspection process, the clearance is inspected for every possible combination of vias.

FIG. 13 is a diagram showing one example of the inspection pattern illustrating the directions along which the wiring lines are to be inspected for clearance. In the figure, reference characters V1 to V10 are the identification numbers of the vias, and reference characters N1 to N13 are the identification numbers of the wiring lines. In the specification of the present invention, the direction along which a wiring line is inspected for clearance will be referred to as the "clearance inspection direction", and the line showing the clearance inspection direction as the "inspection line".

When the wiring lines N1 to N13 are routed in accordance with design data on a substrate where the vias V1 to V10 are formed, the wiring lines N1 to N13 must be inspected for clearance along the clearance inspection directions indicated by the inspection lines shown by dashed lines in the figure. Here, as the clearance inspection is performed for every possible combination of vias, there are as many clearance inspection directions as there are possible combinations of the vias. For example, as shown in FIG. 13, there are very many inspection lines (each shown by a dashed line in the figure).

FIGS. 14a and 14b are diagrams showing another example of the inspection pattern illustrating the directions along which the wiring lines are to be inspected for clearance. In the figure, reference characters V1 to V11 are the identification numbers of the vias, reference characters N1 to N8 are the identification numbers of the wiring lines, and reference characters A1 and A2 are the identification numbers of auxiliary lines (indicated by semi-dashed lines in the figure).

When the wiring lines N1 to N8 are routed passing between the vias V1 to V11 as shown in FIG. 14a, the wiring lines N1 to N8 are inspected for clearance along the clearance inspection directions indicated by the inspection lines shown by dashed lines in the figure.

As earlier described, the clearance inspection directions are determined by the possible combinations of the vias V1 to V11. However, between the vias V8 and V11, for example, there is no wiring line passing between them and, in actuality, there is no need to inspect the wiring line clearance between these vias V8 and V11. Further, in the space between the vias V10 and V3 and between the vias V10 and V4; while the wiring lines N4 to N8 are routed passing through the space, there is no wiring line passing between the vias V3 and V4. Accordingly, once the clearance inspection is performed between the vias V10 and V4, the clearance inspection need not necessarily be performed between the vias V10 and V3.

While, in automatic wiring, it is desirable to be able to obtain the result of the clearance inspection instantly, if the clearance inspection is to be performed for every possible combination of vias, the amount of computation will become enormous, leading to the problem that it takes considerable time to complete the inspection. Here, if the clearance inspection is performed only for those combinations of vias between which the wiring lines pass, unnecessary clearance inspection can be eliminated, and it should become possible to reduce the amount of the computation to be performed by a computer. FIG. 14b shows one example of the inspection pattern after the number of clearance inspection directions has been reduced.

Accordingly, in view of the above problem, it is an object of the present invention to provide a clearance inspection method and apparatus that can efficiently inspect the clearance of wiring lines passing between vias on a substrate.

SUMMARY OF THE INVENTION

To achieve the above object, according to the present invention, when wiring lines are routed passing between vias (obstacles), those vias between which the wiring lines pass are extracted, and the clearance inspection is performed only for such vias, thereby reducing the amount of the computation to be performed by computer.

FIG. 1 is a block diagram showing the basic principle of a clearance inspection apparatus according to a first mode of the present invention.

The clearance inspection apparatus 1 for inspecting the clearance of a wiring line passing between vias on a substrate, comprises:

first determining means 11 for determining vias, adjacent to and on both sides of a reference via, as first adjacent vias, the reference via and the first adjacent vias belonging to a first via row, wherein the reference via serves as a reference in clearance inspection;

second determining means 12 for determining vias adjacent to the first adjacent vias as second adjacent vias, the second adjacent vias belonging to a second via row which is adjacent to the first via row; and third determining means 13 for determining a via located between the second adjacent vias as an inspection target via, wherein the clearance inspection apparatus inspects the clearance of the wiring line passing between the reference via and the inspection target via.

FIG. 2 is a block diagram showing the basic principle of a clearance inspection apparatus according to a second mode of the present invention.

The clearance inspection apparatus 2 for inspecting the clearance of a wiring line passing between vias on a substrate, comprises:

first determining means 21 for determining vias adjacent on both sides of a reference via as first adjacent vias, the reference via and the first adjacent vias belonging to a first via row, wherein the reference via serves as a reference in clearance inspection;

second determining means 22 for determining vias adjacent to the first adjacent vias as second adjacent vias, the second adjacent vias belonging to a second via row which is adjacent to the first via row;

third determining means 23 for determining a via located between the second adjacent vias as an inspection candidate via;

judging means 24 for judging whether or not an inspection line joining the reference via to the inspection candidate via and a wiring line crossing the inspection line cross each other in such a manner as to point in substantially the same tending direction on a virtual plane in which a direction along which the via row containing the reference via extends is taken as a coordinate axis of the virtual plane; and fourth determining means 25 for determining the inspection candidate via as an inspection target via if the judging means 24 has judged that the inspection line associated with the inspection candidate via does not cross the wiring line in such a manner as to point in substantially approximately the same direction as the wiring line, wherein the clearance inspection apparatus inspects the clearance of the wiring line passing between the reference via and the inspection target via.

The means 11 to 13 and 21 to 25 in the clearance inspection apparatuses 1 and 2 can each be implemented in the form of a software program executable by a processing unit such as a computer. The apparatus for implementing the above process and the creation of a program for causing a computer to execute the above process can be readily implemented by those skilled in the art upon understanding the following detailed description. It will also obvious to those skilled in the art that the program for causing a computer to execute the above process is stored on a recording medium.

According to the present invention, as the clearance inspection is performed only for those vias between which the wiring lines pass, the amount of computation necessary for the clearance inspection can be drastically reduced, compared with the prior art which requires performing the clearance inspection for all the vias. As a result, the manufacturing cost of semiconductor packages can be reduced.

BRIEF DESCRIPTION OF THE DRAWINGS

The present invention will be more clearly understood from the description as set below with reference to the accompanying drawings, wherein:

FIGS. 14a and 14b are diagrams showing another example of the inspection pattern illustrating the directions along which wiring lines are to be inspected for clearance.

DESCRIPTION OF THE PREFERRED EMBODIMENTS

Figure 1:
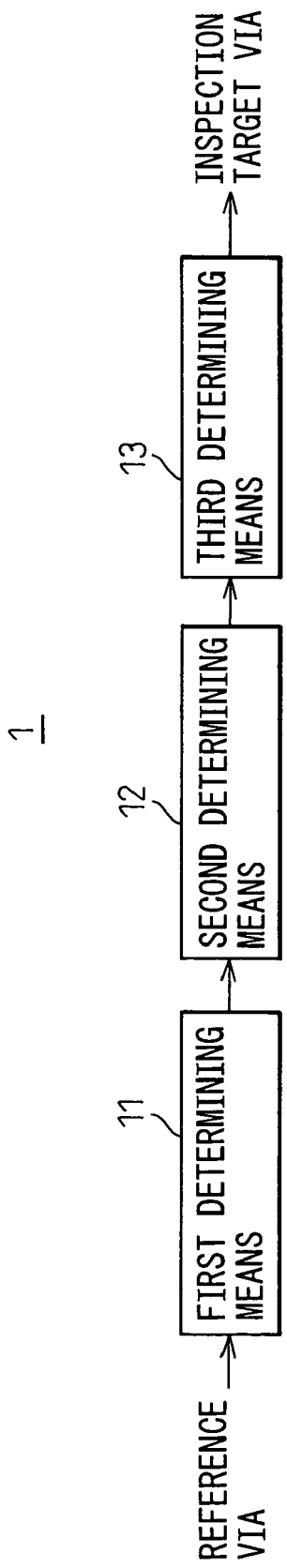
FIG. 1 is a block diagram showing the basic principle of a clearance inspection apparatus according to a first mode of the present invention.
Figure 3:
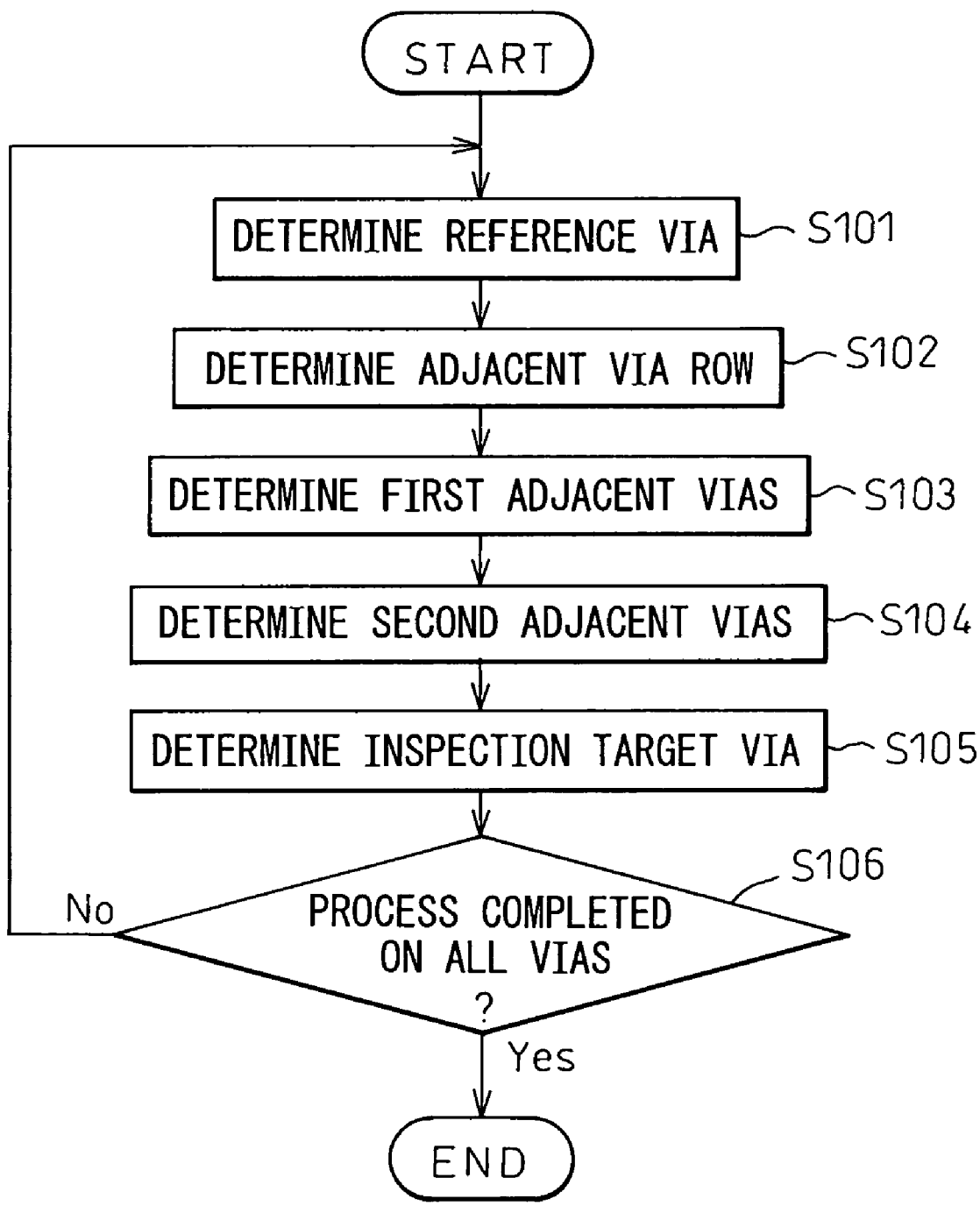
FIG. 3 is a flowchart showing the operation flow of a clearance inspection apparatus according to a first embodiment of the present invention.

FIG. 3 is a flowchart showing the operation flow of a clearance inspection apparatus according to a first embodiment of the present invention. The first embodiment of the present invention corresponds to the first mode of the present invention described with reference to FIG. 1.

First, in step S101, a reference via that serves as a reference in the clearance inspection is determined. Next, in step S102, a second via row adjacent to the first via row to which the reference via belongs is determined. Next, in step S103, vias belonging to the first via row and adjacent on both sides of the reference via are determined as first adjacent vias. Next, in step S104, vias belonging to the second via row and adjacent to the respective first adjacent vias are determined as second adjacent vias. Then, in step S105, a via belonging to the second via row and located between the second adjacent vias is determined as an inspection target via. In the present embodiment, the clearance inspection need only be performed only on the wiring line or lines passing between the reference via and the inspection target via. In step S106, it is determined whether the above process has been completed on all the vias. That is, each via on the substrate is sequentially determined as the reference via and, thus, the clearance inspection is performed over the entire surface of the substrate. In the above process, the order of the steps S102 and S103 may be interchanged.

The above steps S101 to S106 according to the present embodiment are executed by a processing unit such as a computer. Here, it is preferable that design data, rules concerning clearances, and other data such as the coordinates, shape, size, and orientation of each via, substrate information, etc. be entered into the processing unit prior to the execution of step S101. By using the thus entered data, the processing unit initiates processing in step S101.

Figure 4:
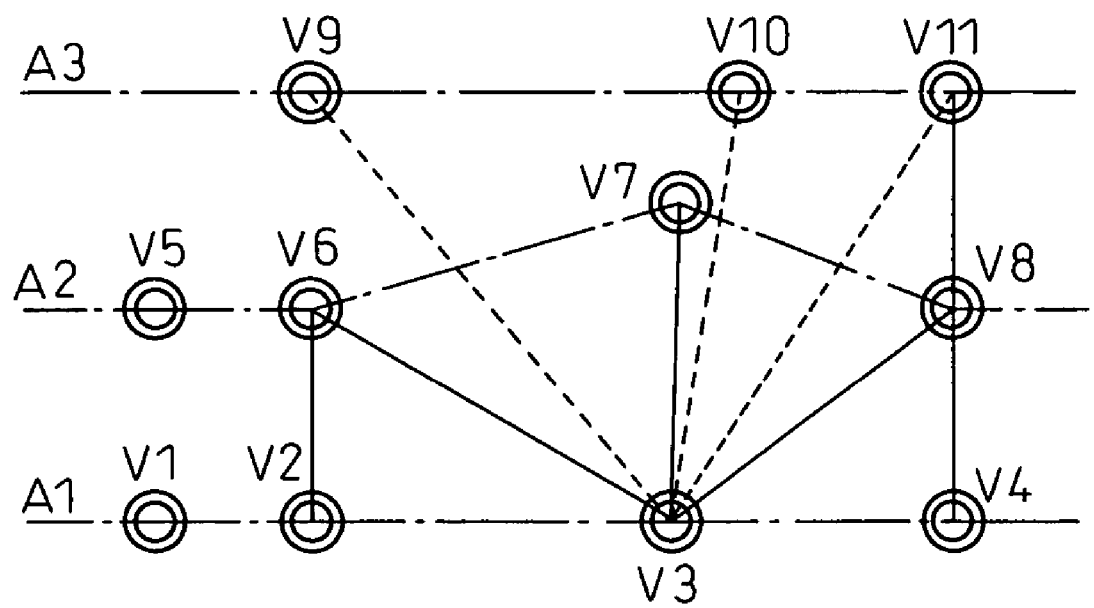
FIG. 4 is a diagram for explaining, by way of a specific example, the process performed by the clearance inspection apparatus according to the first embodiment of the present invention.

FIG. 4 is a diagram for explaining, by way of a specific example, the process performed by the clearance inspection apparatus according to the first embodiment of the present invention. In the figure, reference characters V1 to V11 are the identification numbers of the vias, and reference characters A1 to A3 are the identification numbers of via rows (indicated by semi-dashed lines in the figure). The via rows A1 to A3 show an array of vias arranged in rows.

The specific example here deals with the case where the via V3 is selected as the reference via.

The reference via V3, together with the vias V1, V2, and V4, belongs to the via row A1. The via row adjacent to the via row A1 to which the reference via V3 belongs is the via row A2. In each via row, the vias need not necessarily be arranged in a straight line, but need only be arranged in a successive manner that just enables the vias to be grouped together as a row.

The vias belonging to the via row A1 and adjacent on both sides of the reference via V3 are the vias V2 and V4. Therefore, these vias V2 and V4 are determined as the first adjacent vias in step S103 of FIG. 3 described above.

Further, the vias belonging to the via row A2 and adjacent to the respective vias V2 and V4 are the vias V6 and V8. Therefore, these vias V6 and V8 are determined as the second adjacent vias in step S104 of FIG. 3 described above.

Then, the vias V6, V7, and V8 belonging to the via row A2 and located between the vias V6 and V8 are determined as the inspection target vias.

There is, therefore, no need to perform the clearance inspection along all the directions formed between the reference via V3 and the respective vias V1, V2, and V4 to V11, but the clearance inspection directions can be limited to those formed between the reference via V3 and the respective target vias V6, V7, and V8. For example, clearance inspection directions need not be set between the reference via V3 and the vias V9, V10, and V11.

Figure 2:
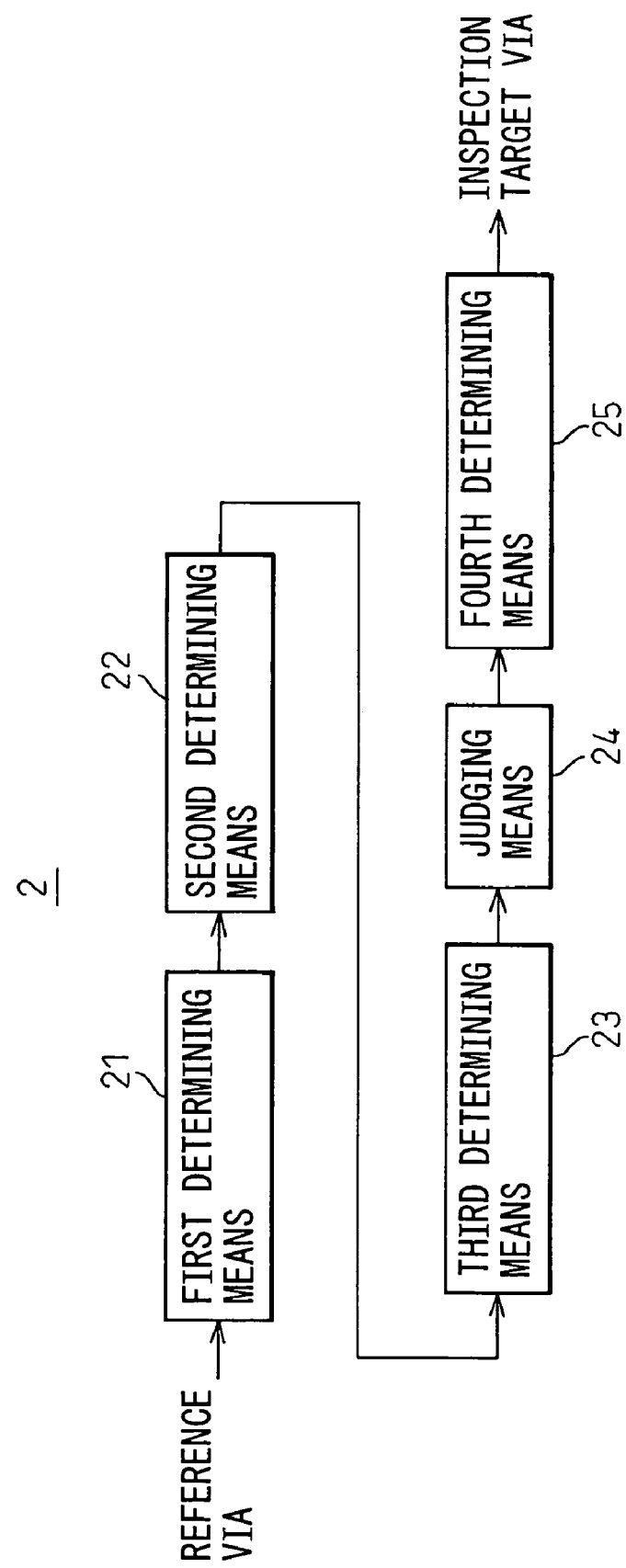
FIG. 2 is a block diagram showing the basic principle of a clearance inspection apparatus according to a second mode of the present invention.

As described above, in the first embodiment of the present invention, each via on the substrate is sequentially set as the reference via, and the above process is repeated to perform the clearance inspection over the entire surface of the substrate. The second embodiment of the present invention hereinafter described aims to further reduce the amount of computation by further limiting the number of clearance inspection directions than the foregoing first embodiment. The second embodiment of the present invention corresponds to the second mode of the present invention described with reference to FIG. 2.

Figure 5A:
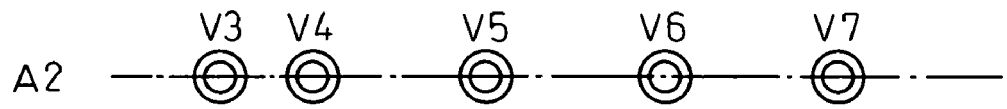
FIGS. 5a to 5c are conceptual diagrams for explaining the operation of the clearance inspection apparatus according to a second embodiment of the present invention.
Figure 5B:
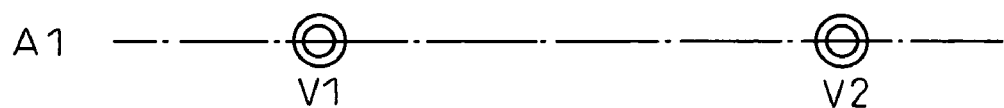
Figure 5C:
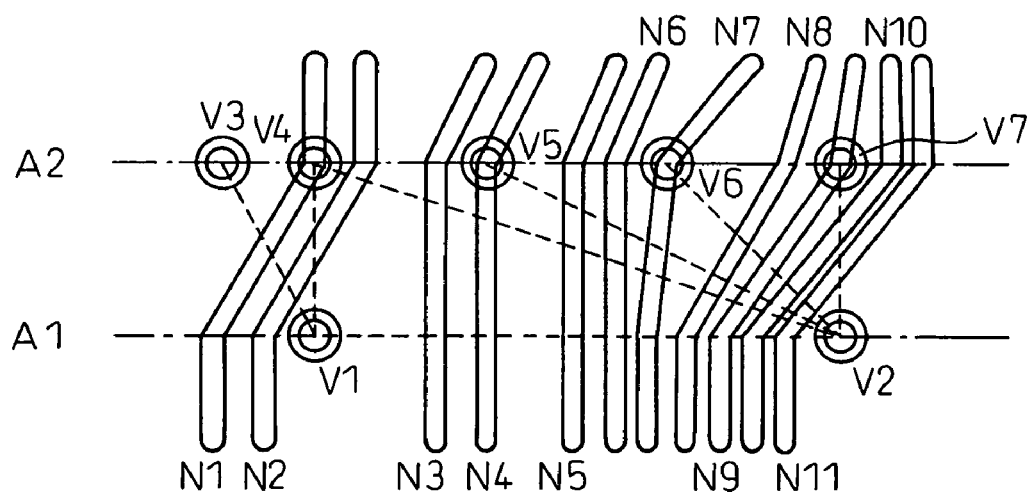

FIGS. 5a to 5c are conceptual diagrams for explaining the operation of the clearance inspection apparatus according to the second embodiment of the present invention. In the figure, reference characters V1 to V7 are the identification numbers of the vias, reference characters N1 to N11 are the identification numbers of the wiring lines, and reference characters A1 and A2 are the identification numbers of the via rows (indicated by semi-dashed lines in the figure).

Here, in the case where, in the foregoing first embodiment, the vias V2 to V7 have been determined as the inspection target vias associated with the reference via V1, and the vias V1 and V3 to V7 as the inspection target vias associated with the reference via V2, as shown in FIG. 5a, clearance inspection directions such as shown in FIG. 5b (inspection lines shown by dashed lines in the figure) are obtained. As can be seen, by merely applying the first embodiment of the present invention to the clearance inspection, the amount of the computation to be performed by computer can be reduced compared with the prior art, as already described.

In the second embodiment of the present invention, of the inspection target vias in FIG. 5b, the vias to be used for the clearance inspection are further limited to those vias between which the wiring lines pass, in order to further reduce the amount of computation and thereby enhance the efficiency of the process.

Here, an explanation will be given by taking as a specific example the case where the wiring lines N1 to N11 are routed as shown in FIG. 5c.

First, the inspection target vias determined in accordance with the first embodiment are regarded as inspection candidate vias in the second embodiment.

In this case, on a virtual plane in which the direction along which the via row containing the reference via extends is taken as a reference coordinate axis, if the inspection line formed by joining the reference via to an inspection candidate via crosses a wiring line in such a manner as to point in approximately the same direction as the wiring line on the virtual plane, the clearance inspection is not performed along the clearance inspection direction defined by that inspection line. On the other hand, if the inspection line does not cross the wiring line in such a manner as to point in approximately the same direction as the wiring line on the virtual plane, that is, if the inspection line crosses the wiring line in such a manner as to face it, the clearance inspection is performed along the clearance inspection direction defined by that inspection line.

For example, for the reference via V1, the inspection candidate vias are the vias V2 to V7. Of these, the inspection line joining the via V1 to the via V3 crosses the wiring lines N1 and N2 in such a manner as to face them, and the inspection line joining the via V1 to the via V4 crosses the wiring line N2 in such a manner as to face it. However, the inspection line joining the via V1 to the via V7, for example, crosses the wiring lines N7 and N8 in such a manner as to point in approximately the same direction as the wiring lines. Accordingly, for the reference via V1, of the inspection candidate vias V2 to V7 the vias V3 and V4 are determined as the inspection target vias.

Further, for the reference via V2, for example, the inspection candidate vias are the vias V1 and V3 to V7. Of these, the inspection line joining the via V2 to the via V4 crosses the wiring lines N2 to N11 in such a manner as to oppose them, the inspection line joining the via V2 to the via V5 crosses the wiring lines N5 to N11 in such a manner as to face them, and the inspection line joining the via V2 to the via V6 crosses the wiring lines N8 to N11 in such a manner as to face them. Accordingly, for the reference via V2, of the inspection candidate vias V1 and V3 to V7 the vias V4 to V6 are determined as the inspection target vias.

As described above, in the present embodiment, each inspection line is classified according to whether the inspection line crosses a wiring line in such a manner as to point in approximately the same direction as the wiring line or in such a manner as to face it, on the virtual plane in which the direction along which the via row containing the reference via extends is taken as the reference coordinate axis; the reason for this is that, by performing the inspection along the clearance inspection direction defined by the inspection line that crosses the wiring line in such a manner as to face it, the clearance which provides a measure of wiring density can be captured more accurately than by performing the inspection along the clearance inspection direction defined by the inspection line that crosses the wiring line in such a manner as to point in approximetely the same direction as the wiring line. Here, an explanation will be given of a specific example of how the crossing of the inspection line and the wiring line is judged.

FIGS. 6a to 6d are diagrams for explaining one specific example of how the crossing of the inspection line and the wiring line is judged in the clearance inspection apparatus according to the second embodiment of the present invention. Here, an xy coordinate plane, where the direction along which the via row containing the reference via extends is taken as the x-coordinate axis of the virtual plane, is defined as shown. In the figure, a thick line or a thin line indicates either the wiring line or the inspection line; for example, when the thick line is the wiring line, then the thin line is the inspection line, and conversely, when the thick line is the inspection line, then the thin line is the wiring line.

In the present invention, on the virtual coordinate plane in which the via row containing the reference via is taken as the reference coordinate axis, if the slope of the inspection line and the slope of the wiring line that crosses the inspection line are equal in sign, it is judged that the inspection line crosses the wiring line in such a manner as to point in approximately the same direction as the wiring line on the virtual plane, but if they are opposite in sign, it is judged that the inspection line does not cross the wiring line in such a manner as to point in approximately the same direction as the wiring line on the virtual plane, that is, the inspection line crosses the wiring line in such a manner as to face it.

Whether the slope of the inspection line and the slope of the wiring line are equal in sign or opposite in sign can be easily determined by calculating the product of the slopes or the quotient of one divided by the other. For example, when the product of the slope of the inspection line and the slope of the wiring line is calculated, if the sign of the product is positive which means that the slopes have the same sign, it is judged that the inspection line crosses the wiring line in such a manner as to point in the same tending direction as the wiring line on the virtual plane, but if the sign of the product is negative which means that the slopes have different signs, it is judged that the inspection line does not cross the wiring line in such a manner as to point in the same tending direction as the wiring line on the virtual plane, that is, the inspection line crosses the wiring line in such a manner as to oppose it. The same applies to the case where the quotient between the slopes is calculated.

Figure 6A:
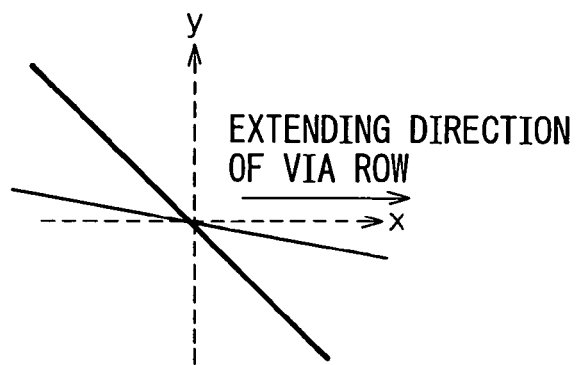
FIGS. 6a to 6d are diagrams for explaining one specific example of how the crossing of an inspection line and a wiring line is judged in the clearance inspection apparatus according to the second embodiment of the present invention.
Figure 6B:
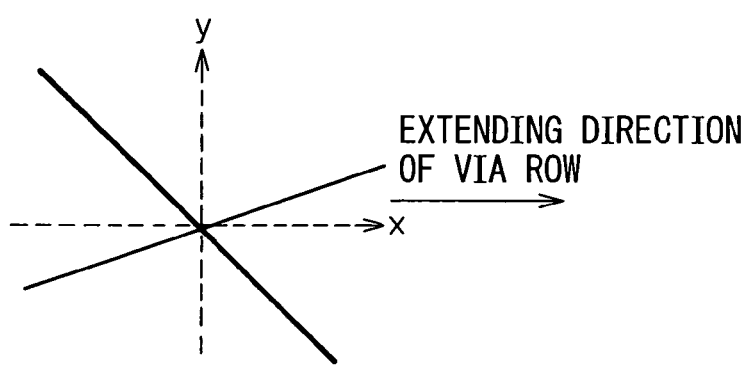
Figure 6C:
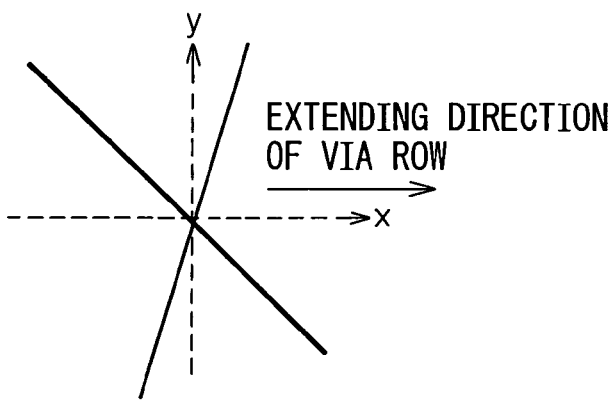
Figure 6D:
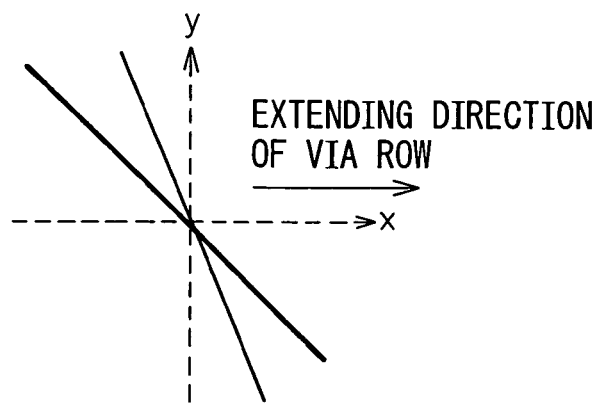

In the examples shown in FIGS. 6a and 6d, as the product of the slope of the inspection line and the slope of the wiring line that crosses it is positive in sign, it is judged that the inspection line crosses the wiring line in such a manner as to point in the same tending direction as the wiring line on the virtual plane. In the examples shown in FIGS. 6b and 6c, as the product of the slope of the inspection line and the slope of the wiring line that crosses it is negative in sign, it is judged that the inspection line does not cross the wiring line in such a manner as to point in the same tending direction as the wiring line on the virtual plane, that is, the inspection line crosses the wiring line in such a manner as to oppose it.

Figure 7:
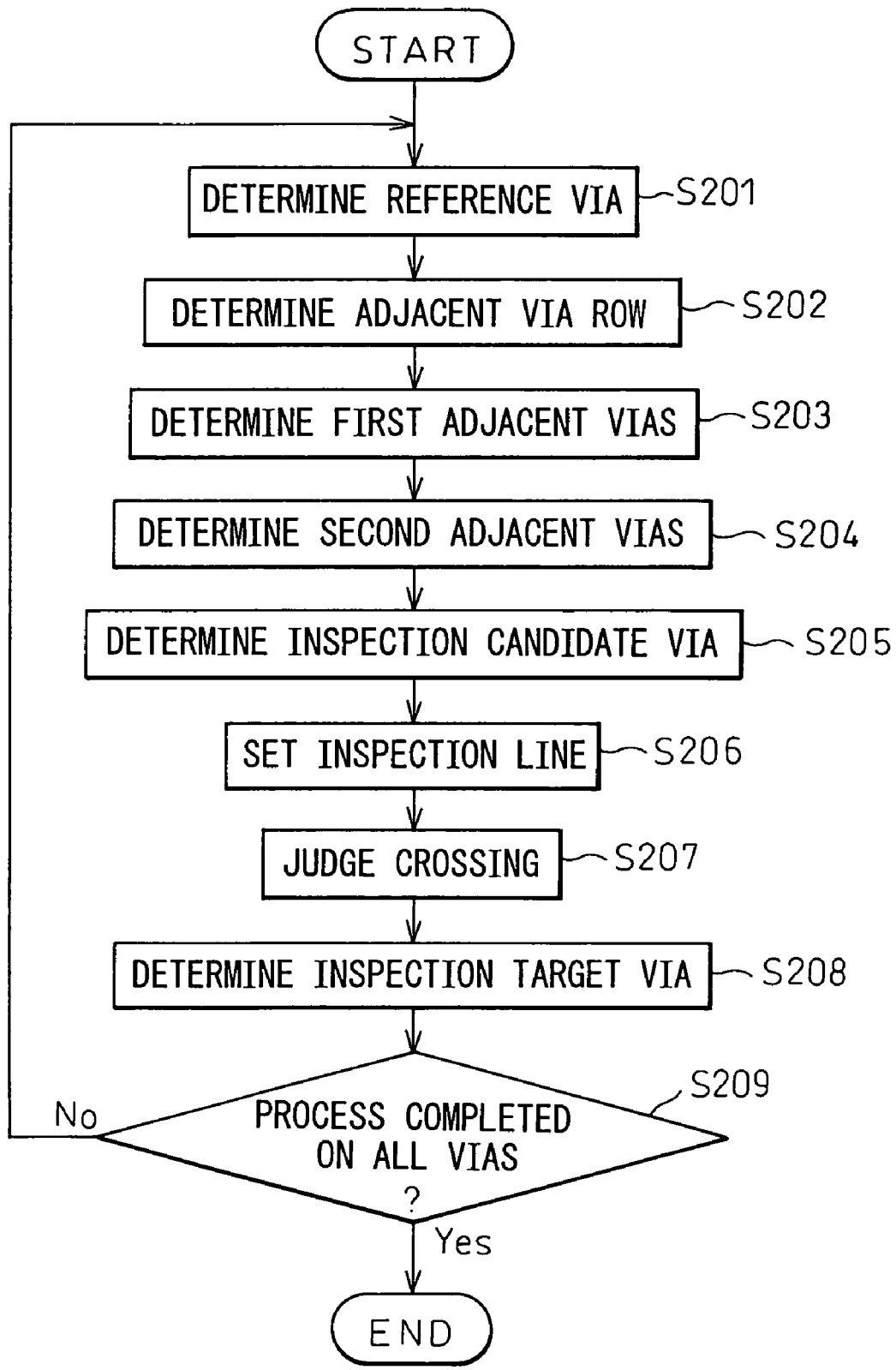
FIG. 7 is a flowchart showing the operation flow of the clearance inspection apparatus according to the second embodiment of the present invention.

FIG. 7 is a flowchart showing the operation flow of the clearance inspection apparatus according to the second embodiment of the present invention.

First, in step S201, the reference via that serves as the reference in the clearance inspection is determined. Next, in step S202, a second via row adjacent to the first via row to which the reference via belongs is determined. Next, in step S203, vias belonging to the first via row and adjacent and on both sides of the reference via are determined as first adjacent vias. Next, in step S204, vias belonging to the second via row and adjacent to the respective first adjacent vias are determined as second adjacent vias. Then, in step S205, each via that belongs to the second via row and that is located between the second adjacent vias is determined as an inspection candidate via. Next, in step S206, for each candidate via, the inspection line joining the reference via to the candidate via is set. Next, in step S207, on the virtual plane in which the direction along which the via row containing the reference via extends is taken as the reference coordinate axis, it is judged whether the wiring line that crosses the inspection line joining the reference via to the inspection candidate via crosses the inspection line in such a manner as to point in the same tending direction as the inspection line on the virtual plane. If it is judged in step S207 that the wiring line does not cross the inspection line in such a manner as to point in the same tending direction as the inspection line on the virtual plane, then in step S208 the inspection candidate via associated with the inspection line is determined as the inspection target via. In step S209, it is determined whether the above process has been completed on all the vias. The clearance inspection need only be performed only on the wiring line or lines passing between the reference via and the inspection target via. Each via on the substrate is sequentially determined as the reference via, and thus the clearance inspection is performed over the entire surface of the substrate.

Here, the principle of operation in steps S201 to S205 is the same as that in steps S101 to S105 in FIG. 3, and the inspection candidate vias determined in step S205 corresponds to the inspection target vias determined in step S105. In the above process, the order of the steps S202 and S203 may be interchanged.

The above steps S201 to S209 according to the present embodiment are executed by a processing unit such as a computer. Here, it is preferable that design data, rules concerning clearances, and other data such as the coordinates, shape, size, and orientation of each via, substrate information, etc. be entered into the processing unit prior to the execution of step S201. By using the thus entered data, the processing unit initiates processing in step S201.

FIGS. 8a to 8d are diagrams (part 1) for explaining, by way of a specific example, the process performed by the clearance inspection apparatus according to the second embodiment of the present invention. In the figure, reference characters V1 to V5 are the identification numbers of the vias, reference characters N1 to N9 are the identification numbers of the wiring lines, and reference characters A1 and A2 are the identification numbers of the via rows (indicated by semi-dashed lines in the figure).

Figure 8A:
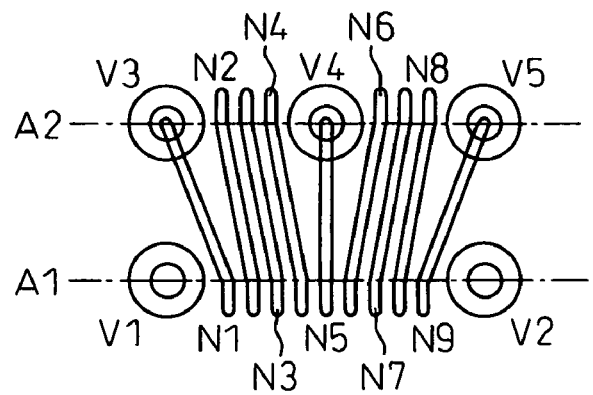
FIGS. 8a to 8d are diagrams (part 1) for explaining, by way of a specific example, the process performed by the clearance inspection apparatus according to the second embodiment of the present invention.

This specific example considers the case where the vias V3 to V5 are designated as the inspection candidate vias associated with the reference vias V1 and V2, and the wiring lines N1 to N9 are routed between the vias, as shown in FIG. 8a.

Figure 8B:
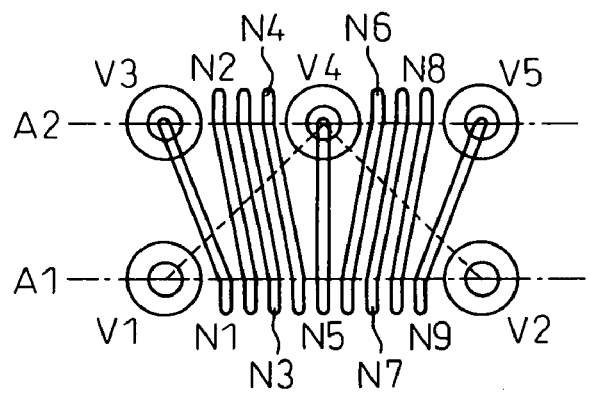
Figure 8C:
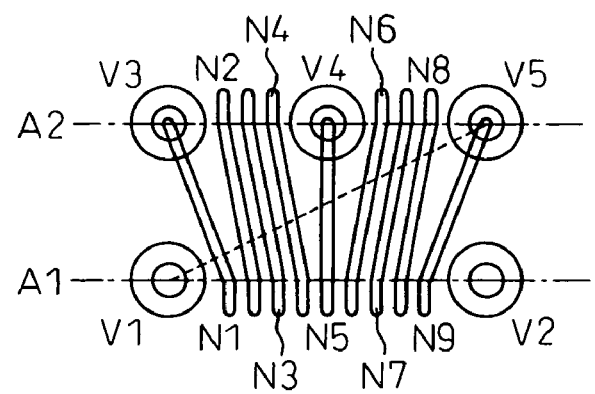

For the reference via V1, there are a total of three possible inspection lines from the reference via V1 to the respective inspection candidate vias V3, V4, and V5. Of these, the inspection line joining the reference via V1 to the inspection candidate via V3 does not cross any wiring line, as shown in FIG. 8b; therefore, there is no need to perform the clearance inspection along the clearance inspection direction defined by this inspection line. On the other hand, the inspection line joining the reference via V1 to the inspection candidate via V4 crosses the wiring lines N1 to N4 in such a manner as to oppose them, as shown in FIG. 8b; therefore, the clearance inspection direction defined by this inspection line is taken as a clearance inspection target. That is, the inspection candidate via V4 is determined as the inspection target via for the reference via V1. Further, as shown in FIG. 8c, the inspection line joining the reference via V1 to the inspection candidate via V5 crosses the wiring lines N1 to N4 in such a manner as to oppose them, but crosses the wiring lines N6 to N8 in such a manner as to point in the same tending direction as the wiring lines; therefore, the clearance inspection direction defined by this inspection line is not taken as a clearance inspection target.

Figure 8D:
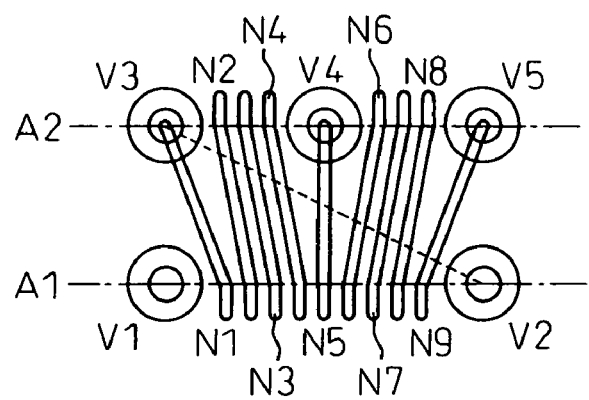

For the reference via V2, there are a total of three possible inspection lines from the reference via V2 to the respective inspection candidate vias V3, V4, and V5. Of these, the inspection line joining the reference via V2 to the inspection candidate via V5 does not cross any wiring line, as shown in FIG. 8b; therefore, there is no need to perform the clearance inspection along the clearance inspection direction defined by this inspection line. On the other hand, the inspection line joining the reference via V2 to the inspection candidate via V4 crosses the wiring lines N6 to N9 in such a manner as to oppose them, as shown in FIG. 8b; therefore, the clearance inspection direction defined by this inspection line is taken as a clearance inspection target. That is, the inspection candidate via V4 is determined as the inspection target via for the reference via V2. Further, as shown in FIG. 8d, the inspection line joining the reference via V2 to the inspection candidate via V3 crosses the wiring lines N6 to N9 in such a manner as to oppose them, but crosses the wiring lines N2 to N4 in such a manner as to point in the same tending direction as the wiring lines; therefore, the clearance inspection direction defined by this inspection line is not taken as a clearance inspection target.

For the wiring lines passing between the vias V1 and V2, the clearance inspection should be performed as usual.

Figure 9A:
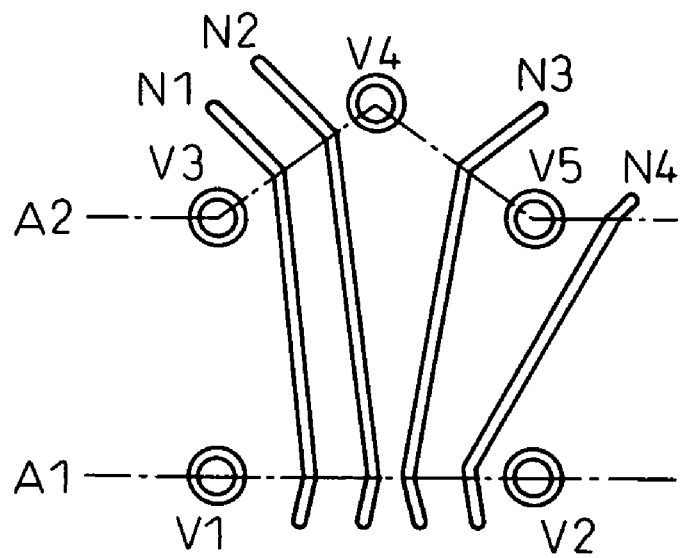
FIGS. 9a and 9b are diagrams (part 2) for explaining, by way of a specific example, the process performed by the clearance inspection apparatus according to the second embodiment of the present invention.
Figure 9B:
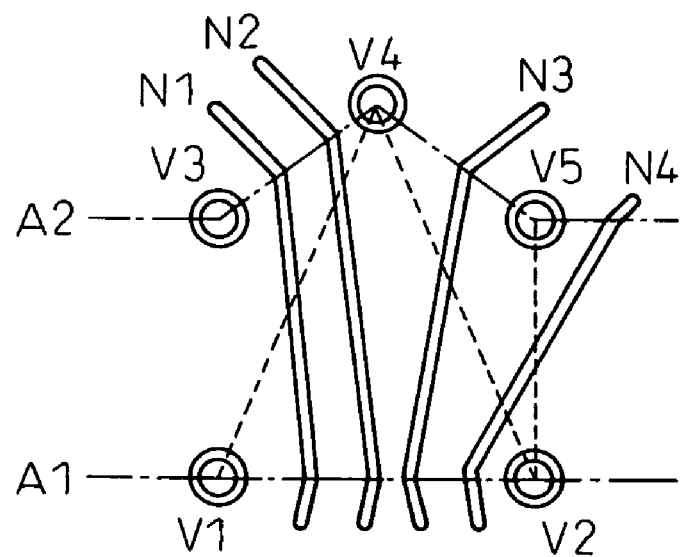

FIGS. 9a and 9b are diagrams (part 2) for explaining, by way of specific example, the process performed by the clearance inspection apparatus according to the second embodiment of the present invention. In the figure, reference characters V1 to V5 are the identification numbers of the vias, reference characters N1 to N4 are the identification numbers of the wiring lines, and reference characters A1 and A2 are the identification numbers of the via rows (indicated by semi-dashed lines in the figure).

This specific example considers the case where the vias V3 to V5 are designated as the inspection candidate vias associated with the reference vias V1 and V2, and the wiring lines N1 to N4 are routed passing between the vias, as shown in FIG. 9a.

For the reference via V1, the inspection line joining the reference via V1 to the inspection candidate via V4 crosses the wiring lines N1 and N2 in such a manner as to oppose them, as shown in FIG. 9b; therefore, the clearance inspection direction defined by this inspection line is taken as a clearance inspection target. That is, the inspection candidate via V4 is determined as the inspection target via for the reference via V1, and the clearance inspection directions associated with the other vias are excluded from the clearance inspection targets.

On the other hand, for reference via V2, as shown in FIG. 9b, the inspection line joining the reference via V2 to the inspection candidate via V4 crosses the wiring lines N3 and N4 in such a manner as to oppose them, and the inspection line joining the reference via V2 to the inspection candidate via V5 crosses the wiring line N4 in such a manner as to oppose it; therefore, the clearance inspection directions defined by these inspection lines are taken as clearance inspection targets. That is, the inspection candidate vias V4 and V5 are determined as the inspection targets via for the reference via V2, and the clearance inspection directions associated with the other vias are excluded from the clearance inspection targets.

Figure 10A:
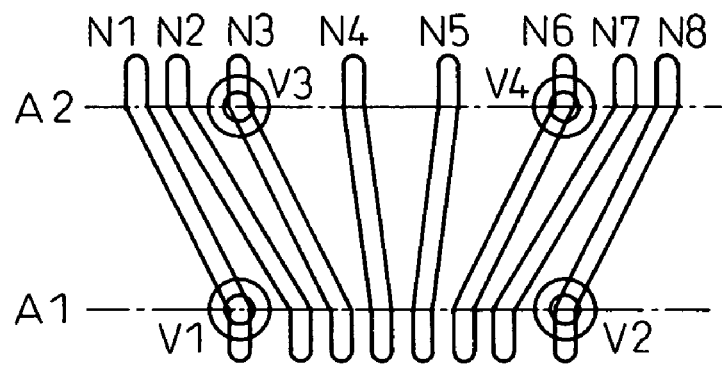
FIGS. 10a to 10c are diagrams (part 3) for explaining, by way of a specific example, the process performed by the clearance inspection apparatus according to the second embodiment of the present invention.
Figure 10B:
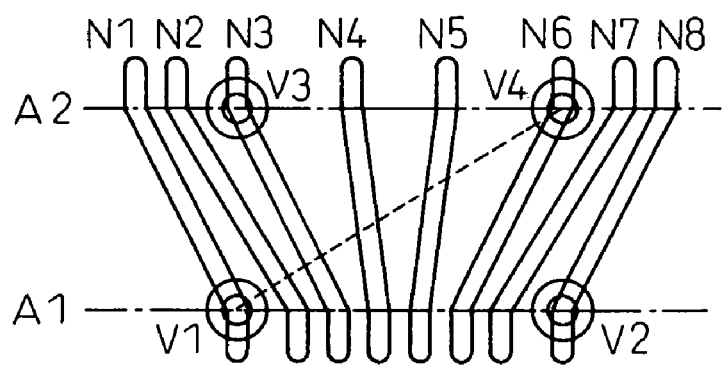
Figure 10C:
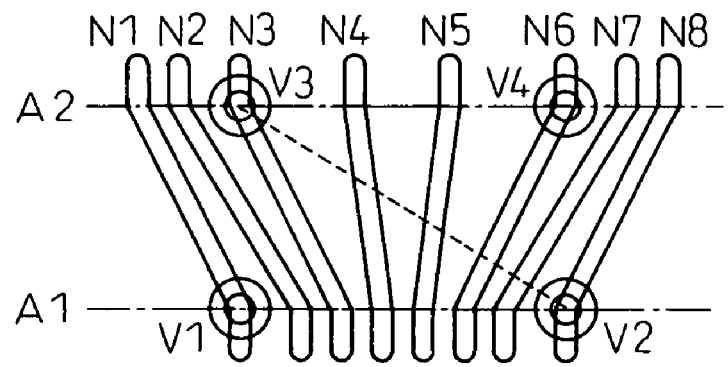

FIGS. 10a to 10c are diagrams (part 3) for explaining, by way of specific example, the process performed by the clearance inspection apparatus according to the second embodiment of the present invention. In the figure, reference characters V1 to V4 are the identification numbers of the vias, reference characters N1 to N8 are the identification numbers of the wiring lines, and reference characters A1 and A2 are the identification numbers of the via rows (indicated by semi-dashed lines in the figure).

In this specific example, the wiring lines N2 to N7 are routed passing between the vias V1 and V2, but only the wiring lines N4 and N5 are routed passing between the vias V3 and V4, as shown in FIG. 10a; that is, the wiring lines N1 to N4 and the wiring lines N5 to N8 are routed in such a manner as to spread in respectively different directions. In this case, as shown in FIG. 10b, the inspection line joining the reference via V1 to the inspection candidate via V4 crosses the wiring lines N2 to N4 in such a manner as to oppose them, but crosses the wiring line N5 in such a manner as to point in the same tending direction as the wiring line N5; therefore, the clearance inspection direction defined by this inspection line is not taken as a clearance inspection target. Likewise, as shown in FIG. 10c, the inspection line joining the reference via V2 to the inspection candidate via V3 crosses the wiring lines N5 to N7 in such a manner as to oppose them, but crosses the wiring line N4 in such a manner as to point in the same tending direction as the wiring line N4; therefore, the clearance inspection direction defined by this inspection line is not taken as a clearance inspection target. That is, in the case of FIG. 10a, it is sufficient to perform the clearance inspection on the wiring lines N2 to N7 passing between the vias V1 and V2 and on the wiring lines N4 and N5 passing between the vias V3 and V4.

As described above, according to the second embodiment of the present invention, and as, of the inspection target vias designated in the first embodiment, the vias to be used for the clearance inspection are further limited to those vias between which the wiring lines pass, the amount of computation performed by computer can be further reduced.

Figures 11, 12:
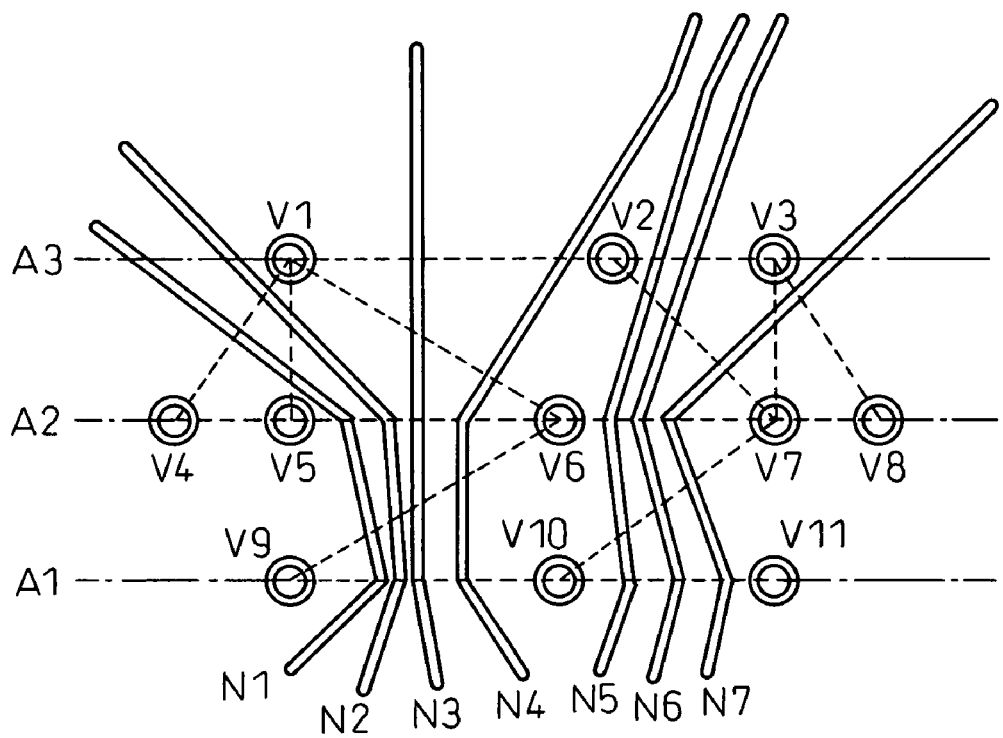
FIG. 11 is a diagram showing one specific example of an inspection pattern illustrating the clearance inspection directions obtained by the clearance inspection apparatus according to the second embodiment of the present invention.
FIG. 12 is a diagram showing a table defining the combinations of reference vias and their associated inspection target vias in the specific example shown in FIG. 11.
Figure 13:
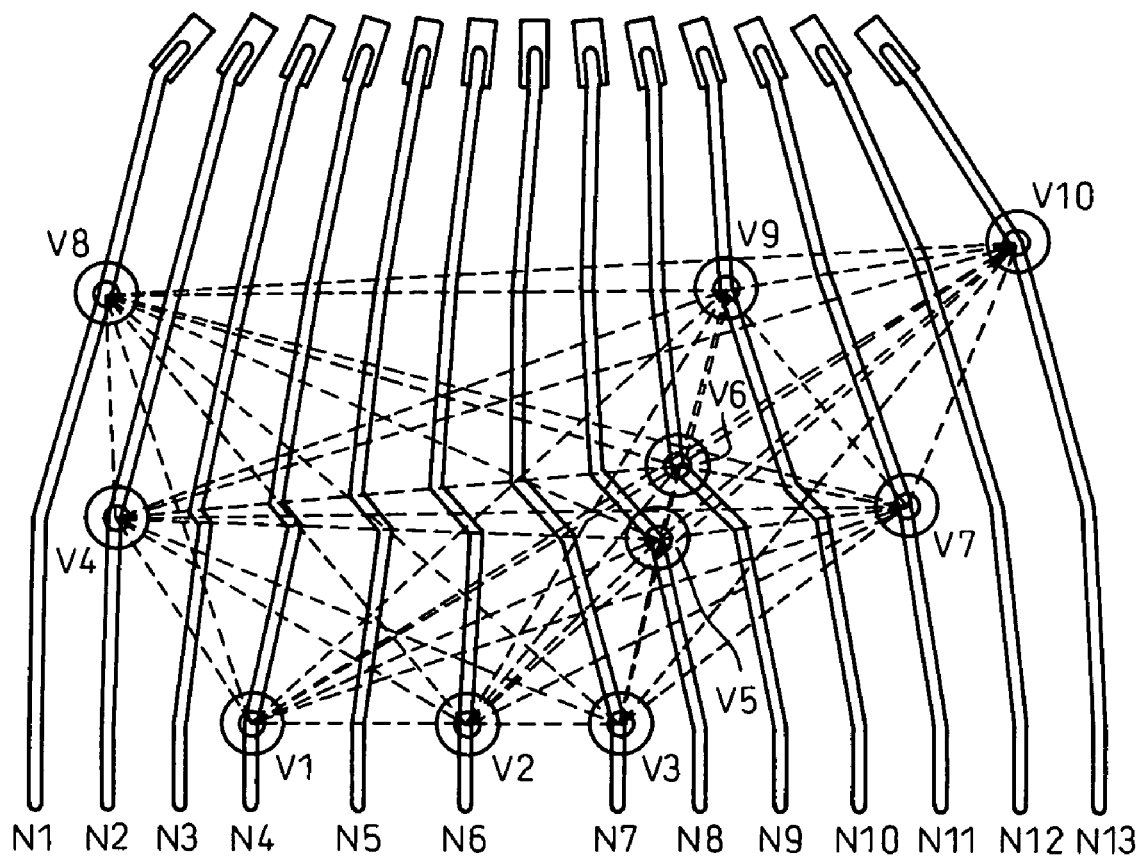
FIG. 13 is a diagram showing one example of an inspection pattern illustrating the directions along which wiring lines are to be inspected for clearance.

FIG. 11 is a diagram showing one specific example of the inspection pattern illustrating the clearance inspection directions obtained by the clearance inspection apparatus according to the second embodiment of the present invention. In the figure, reference characters V1 to V11 are the identification numbers of the vias, reference characters N1 to N7 are the identification numbers of the wiring lines, and reference characters A1 to A3 are the identification numbers of the via rows (indicated by semi-dashed lines in the figure). When the clearance inspection method of the present embodiment is applied to the substrate on which the vias are formed as shown in the figure, the clearance inspection directions along which the wiring lines passing between the vias are to be inspected for clearance are those defined along the inspection lines indicated by dashed lines.

FIG. 12 is a diagram showing a table defining the combinations of the reference vias and their associated inspection target vias. The clearance inspection directions obtained by the clearance inspection apparatus of the present embodiment can be expressed in the form of a table defining the combinations of the reference vias and their associated inspection target vias. For example, this table shows that when the via V10 in the via row A1 is the reference via, the vias V11 and V7 are the inspection target vias. In this way, when the data concerning the table in which the reference vias are stored along with their associated inspection target vias is created using a computer, it becomes easier to implement the clearance inspection by using the created data. Such a table may be constructed in the first embodiment as well.

The present invention may be carried out in combination with the invention disclosed in Japanese Unexamined Patent Publication No. 2002-083006. In the invention disclosed in this Patent Document 1, only wiring routes are determined in advance in a rough wiring step, and then, in a wiring forming step, the wiring lines are laid automatically and uniformly by considering clearances (lines and spaces) while checking them against the actual design rules. In the invention disclosed in the above Patent Document 1, clearances in the circumferential direction along which the via rows are arranged (hereinafter called the "horizontal direction") have been inspected during the automatic wiring process, but clearances in the direction directed from the innermost circumference toward the outermost circumference (hereinafter called the "vertical direction") or in oblique directions have not been inspected. Accordingly, when the present invention is used in combination, it also becomes possible to efficiently perform the clearance inspection along the vertical and oblique directions in the invention disclosed in Patent Document 1, and this offers an enormous effect. When carrying out the present invention in combination with the invention disclosed in the above Patent Document 1, the auxiliary lines used to determine the wiring routes in the invention disclosed in Patent Document 1 should be used by regarding each of them as a "via row" which is one of the parameters used in the present invention.

According to the present invention, as the clearance inspection is performed only for those vias between which the wiring lines pass, the amount of computation necessary for the clearance inspection can be drastically reduced, compared with the prior art which requires performing the clearance inspection for all the vias. As a result, the manufacturing cost of semiconductor packages can be reduced.

For example, the present invention can drastically reduce the amount of the computation to be performed by computer in the clearance inspection when designing wiring for a semiconductor package such as a PBGA or an EBGA package. Accordingly, as the time required for the clearance inspection is reduced and the designer can obtain the inspection results quickly, the designer whose burden is alleviated can further concentrate his effort on the design work, and a further improvement in design quality can thus be expected.

Further, when the present invention is carried out in combination with the invention disclosed in Japanese Unexamined Patent Publication No. 2002-083006, more efficient automatic wiring design can be achieved.

What is claimed is:

1. A clearance inspection apparatus for inspecting clearance of a wiring line passing between vias on a substrate, comprising:
    first determining means for determining vias adjacent on both sides of a reference via as first adjacent vias, said reference via and said first adjacent vias belonging to a first via row, wherein said reference via serves as a reference in a clearance inspection;
    second determining means for determining vias adjacent to said first adjacent vias as second adjacent vias, said second adjacent vias belonging to a second via row which is adjacent to said first via row; and
    third determining means for determining a via located between said second adjacent vias as an inspection target via, wherein
    said clearance inspection apparatus inspects the clearance of said wiring line passing between said reference via and said inspection target via.

2. A clearance inspection apparatus as claimed in claim 1, further comprising constructing means for constructing a table showing a combination of said reference via and said inspection target via associated with said reference via.

3. A clearance inspection apparatus for inspecting clearance of a wiring line passing between vias on a substrate, comprising:
    first determining means for determining vias adjacent on both sides of a reference via as first adjacent vias, said reference via and said first adjacent vias belonging to a first via row, wherein said reference via serves as a reference in clearance inspection;
    second determining means for determining vias adjacent to said first adjacent vias as second adjacent vias, said second adjacent vias belonging to a second via row which is adjacent to said first via row;
    third determining means for determining a via located between said second adjacent vias as an inspection candidate via;
    judging means for judging whether or not an inspection line joining said reference via to said inspection candidate via and a wiring line crossing said inspection line cross each other in such a manner as to point in substantially the same direction on a virtual plane in which a direction: along which the first via row containing said reference via extends, is taken as a coordinate axis of said virtual plane; and
    fourth determining means for determining said inspection candidate via as an inspection target via if said judging means has judged that said inspection line associated with said inspection candidate via does not cross said wiring line in such a manner as to point in substantially the same tending direction as said wiring line, wherein
    said clearance inspection apparatus inspects the clearance of said wiring line passing between said reference via and said inspection target via.

4. A clearance inspection apparatus as claimed in claim 3, wherein said judging means includes:
    means for judging that said inspection line and said wiring line crossing said inspection line do not cross each other in such a manner as to point in substantially the same direction on a virtual coordinate plane in which said first via row is taken as a reference coordinate axis, when a slope of said inspection line on said virtual coordinate plane and the slope of said wiring line on said virtual coordinate plane have the same sign.

5. A clearance inspection apparatus as claimed in claim 3, further comprising constructing means for constructing a table showing a combination of said reference via and said inspection target via associated with said reference via.

6. A clearance inspection method for inspecting clearance of a wiring line passing between vias on a substrate, comprising:
   a first computational step for determining vias adjacent on both sides of a reference via as first adjacent vias, said reference via and said first adjacent vias belonging to a first via row wherein said reference via serves as a reference in a clearance inspection;
   a second computational step for determining vias adjacent to said first adjacent vias as second adjacent vias, said second adjacent vias belonging to a second via row which is adjacent to said first via row; and
   a third computational step for determining a via located between said second adjacent vias as an inspection target via, wherein
   said clearance inspection method inspects the clearance of said wiring line passing between said reference via and said inspection target via.

7. A clearance inspection method as claimed in claim 6, further comprising a constructing step for constructing a table showing a combination of said reference via and said inspection target via associated with said reference via.

8. A clearance inspection method for inspecting clearance of a wiring line passing between vias on a substrate, comprising:
   a first computational step for determining vias adjacent on both sides of a reference via as first adjacent vias, said reference via and said first adjacent vias belonging to a first via row, wherein said reference via serves as a reference in a clearance inspection;
   a second computational step for determining vias adjacent to said first adjacent vias as second adjacent vias, said second adjacent vias belonging to a second via row which is adjacent to said first via row;
   a third computational step for determining a via located between said second adjacent vias as an inspection candidate via;
   a judging step for judging whether or not an inspection line joining said reference via to said inspection candidate via and a wiring line crossing said inspection line cross each other in such a manner as to point in substantially the same direction on a virtual plane in which a direction along which the first via row containing said reference via extends is taken as a coordinate axis of said virtual plane; and
   a fourth computational step for determining said inspection candidate via as an inspection target via if it is judged in said judging step that said inspection line associated with said inspection candidate via does not cross said wiring line in such a manner as to point in substantially approximately the same tending direction as said wiring line, wherein
   said clearance inspection method inspects the clearance of said wiring line passing between said reference via and said inspection target via.

9. A clearance inspection method as claimed in claim 8, wherein said judging step judges that said inspection line and said wiring line crossing said inspection line do not cross each other in such a manner as to point in substantially the same tending direction on a virtual coordinate plane in which said first via row is taken as a reference coordinate axis, when a slope of said inspection line on said virtual coordinate plane and the slope of said wiring line on said virtual coordinate plane have the same sign.

10. A clearance inspection method as claimed in claim 8, further comprising a constructing step for constructing a table showing a combination of said reference via and said inspection target via associated with said reference via.

* * * * *

UNITED STATES PATENT AND TRADEMARK OFFICE
CERTIFICATE OF CORRECTION

| | | |
|---|---|---|
| PATENT NO. | : 7,191,415 B2 | Page 1 of 1 |
| APPLICATION NO. | : 11/104615 | |
| DATED | : March 13, 2007 | |
| INVENTOR(S) | : Tamotsu Kitamura et al. | |

It is certified that error appears in the above-identified patent and that said Letters Patent is hereby corrected as shown below:

Column 7, Line 12, change "approximetely" to --approximately--.

Column 12, Line 44, change "direction:" to --direction,--.

Column 13, Line 9, after "row" insert --,--.

Column 14, Line 12, change "compulational" to --computational--.

Signed and Sealed this

Twenty-fourth Day of July, 2007

JON W. DUDAS
*Director of the United States Patent and Trademark Office*